ELECTRICAL CIRCUIT EMPLOYING A FERROELECTRIC CAPACITOR

Filed Dec. 12, 1958

INVENTOR
R. M. WOLFE
BY
R. C. Winter
ATTORNEY 2,984,754

ELECTRICAL CIRCUIT EMPLOYING A FERRO-ELECTRIC CAPACITOR

Robert M. Wolfe, Colonia, N.J., assignor to Bell Telephone Laboratories, Incorporated, New York, N.Y., a corporation of New York Filed Dec. 12, 1958, Ser. No. 779,941

20 Claims. (Cl. 307—88.5)

This invention relates to trigger circuits and more particularly to such circuits employing a ferroelectric capacitor as a control element.

Multivibrator circuits which are capable of producing output pulses of predetermined magnitude and duration upon the application of input signals are known in the art. These circuits may be of the bistable type, which undergo a change of output state for each input signal, or of the monostable type, also known as pulse regenerative amplifiers, in which the circuit goes through one complete output cycle for each input signal. Furthermore, similar circuits which are self-triggering, that is, which produce output pulses without the application of input signals, are known. It is also known that circuits of the types just mentioned may be employed in pulse delay and pulse counting circuits to produce an output pulse delayed in time from some input signal or a single output pulse in response to a predetermined number of input pulses, as the case may be.

Circuits of the general types described above depend upon the charge transferred by, or stored in, a particular capacitor to control the time in which the circuit remains in a particular output state. As a result, the output pulse width and, in the case of the self-triggering circuit, the pulse repetition rate, are critically dependent upon the particular values of resistors and capacitors or other elements which make up the timing circuit, the threshold voltage of the switching portion of the circuit and the operating voltages thereof.

It is an object of this invention to provide an improved pulse regenerative circuit having greater precision in timing, economy of components and reliability than was heretofore attainable. Furthermore, it is an object of this invention to provide, in such a circuit, an improved arrangement for determining a time delay between input and output pulses.

Another object of this invention is to provide an improved pulse counting circuit which is simpler in operation and uses fewer components than those of the prior art.

A further object of this invention is to provide a simple transistor self-triggering multivibrator having improved control of output pulse width and repetition rate.

One specific embodiment of my invention comprises a pair of transistors cross-connected by feedback paths and arranged so that only one transistor is conducting at a time. One of these feedback paths includes a ferroelectric capacitor to control accurately the time during which the pulse regenerative circuit remains in its active state. As is well known, a ferroelectric capacitor exhibits a substantially rectangular hysteresis loop with a pair of remanent dielectric polarization states. A signal pulse applied to the circuit input terminal reverses the remanent polarization of the ferroelectric capacitor and thereafter switches the pulse regenerative circuit to its active state. Upon the termination of the input signal, the ferroelectric capacitor is returned to its initial state of remanent polarization. During this process the ferroelectric capacitor readily transfers charge and permits the pulse regenerative circuit to remain in its active state. Once the switching of the polarization of the ferroelectric capacitor is complete, however, the transfer of charge is suddenly cut off and the pulse regenerative circuit is returned to its quiescent condition. It is the sudden termination of charge transfer by the ferroelectric capacitor which provides the precise determination of the time at which the pulse regenerative circuit changes state.

With the addition to the above-described embodiment of my invention of a charge metering circuit such as is known in the art, there is provided the second specific embodiment of my invention, which comprises a novel pulse counting circuit. In this specific embodiment the ferroelectric capacitor which controls the pulse regenerative circuit accepts discrete packets of charge from the charge metering portion of the circuit. Each of these packets partially reverses the dielectric polarization of the ferroelectric capacitor. Upon the complete reversal of this polarization, the next succeeding charge packet is directed to one transistor of the pulse regenerative circuit, causing the circuit to switch to its active state and to produce an output pulse. Thereafter the circuit is restored to its initial condition in the manner described with respect to the first-mentioned specific embodiment of my invention. Thus, a novel pulse counting circuit is provided in accordance with my invention which produces a single output pulse in response to the application of a predetermined number of input pulses.

A third specific embodiment of my invention utilizes the monostable multivibrator with the ferroelectric capacitor in one feedback path in conjunction with a transistor amplifier and an additional feedback path to provide a self-triggering multivibrator suitable for pulse generation.

Another specific embodiment of my invention comprises an improved self-triggering multivibrator circuit in which an internally biased ferroelectric capacitor, such as one having a dielectric of guanidinium aluminum sulfate hexahydrate, is employed in a feedback path of a conventional pulse regenerative amplifier. Advantageously, in this embodiment the biased ferroelectric capacitor controls the initiation as well as the termination of each of the output pulses.

It is a feature of this invention that a ferroelectric capacitor be employed in a pulse regenerative circuit to control the timing of one portion of the output pulse cycle.

Additionally, it is a feature of this invention that a ferroelectric capacitor be provided in a pulse regenerative circuit to control the delay of the output pulse as well as its pulse width.

More specifically, it is a feature of this invention that a ferroelectric capacitor be connected in the feedback path of a transistor multivibrator to control the turnoff of an associated transistor.

It is an additional feature of one specific embodiment of this invention that an internally biased ferroelectric capacitor be employed in a conventional pulse regenerative circuit to provide a self-triggering multivibrator in which the biased ferroelectric capacitor controls the repetition rate and duty cycle of the output pulses.

It is another feature of this invention that a ferroelectric capacitor be connected in a pulse counting circuit so as to combine the functions of input pulse storage and output pulse width control.

It is a further feature of this invention that a ferroelectric capacitor be combined with a constant current circuit to control the repetition rate of a self-triggering multivibrator.

A complete understanding of this invention and of these and various other features thereof may be gained from the following detailed description and the accompanying drawing in which.

Figure 1:
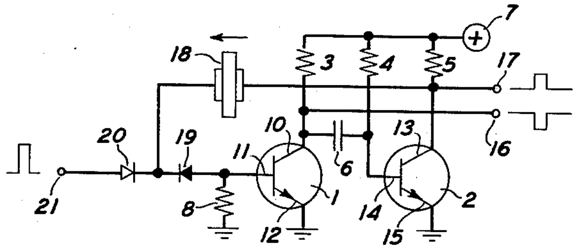
Fig. 1 is a schematic representation of one specific embodiment of my invention comprising a monostable multivibrator, or pulse regenerative amplifier.

In Fig. 1 there is represented schematically one specific embodiment of my invention in which transistors 1 and 2 of like conductivity type are shown in the transistor analog of a known configuration of a pulse regenerating circuit as disclosed, for example, in Radiation Laboratory Series, vol. 19, by Chance et al. at page 168, 1st edition, McGraw-Hill (1949). Transistor 2 is normally maintained in the conducting condition by the bias voltages applied from ground and the positive source 7 through resistors 4 and 5. Transistor 1 is normally maintained in the open circuit condition by bias voltages applied from ground and the source 7 through resistors 3 and 8.

Collector 10 of transistor 1 and collector 13 of transistor 2 have output terminals 16 and 17 respectively connected thereto. Capacitor 6 provides a coupling path between collector 10 of transistor 1 and base 14 of transistor 2. Ferroelectric capacitor 18 is connected between the collector 13 of transistor 2 and the input side of transistor 1. Between the ferroelectric capacitor 18 and the base 11 of transistor 1 there is connected a reverse breakdown diode 19 poled with its anode toward the base 11. The reverse breakdown diode differs from a conventional rectifier in that above the breakdown potential it conducts current readily in the reverse direction. Connected between an input terminal 21 and the common connection of the ferroelectric capacitor 18 and the breakdown diode 19 is a conventional semiconductor rectifier 20 poled to pass positive signals from the input terminal 21.

In the circuit of Fig. 1 the ferroelectric capacitor 18 is normally polarized in the direction indicated by the adjacent arrow; that is, its remanent dielectric polarization was established by current flowing in the direction of the arrow. A positive pulse applied from a current source at input terminal 21 produces current through rectifier 20, ferroelectric capacitor 18 and the conducting transistor 2 which tends to reverse the indicated polarization of ferroelectric capacitor 18. Until the dielectric polarization of the ferroelectric capacitor 18 is reversed, this current is prevented from reaching the base 11 of transistor 1 by the breakdown diode 19, the threshold voltage of which is larger than the voltage required to switch the ferroelectric capacitor 18. When the ferroelectric capacitor 18 has been switched, however, blocking further current flow therethrough, the voltage level builds up at the diode 19 until the threshold is reached, at which point diode 19 breaks down, and the input pulse is then applied to the base 11 of transistor 1 to turn it on. The turning on of transistor 1 produces a negative pulse at the collector 10 which is transmitted through capacitor 6 to the base 14 of transistor 2 to turn transistor 2 off, thereby producing a positive output pulse at the terminal 17. This condition is maintained until the termination of the input pulse at the terminal 21. Then the ferroelectric capacitor 18 is restored to its initial remanent polarization by current flowing from source 7 through resistor 5, the ferroelectric capacitor 18, breakdown diode 19 and transistor 1, which thus continues to conduct. However, once the ferroelectric capacitor 18 has been switched back to its original state of remanent polarization, the current therethrough is abruptly terminated and transistor 1 is turned off. This abrupt termination of current in the feedback path through the ferroelectric capacitor 18 advantageously provides a more accurate control of the termination of the output pulse than has heretofore been possible with conventional resistor-capacitor flip-flop circuits. The positive pulse at the collector 10 resulting from the turnoff of transistor 1 is coupled through capacitor 6 to the base 14 of transistor 2 which is thereupon turned on to restore the quiescent condition of the circuit. Thus, for each input signal applied to the terminal 21, a pair of substantially rectangular pulses of opposite polarities are generated at the output terminals 16 and 17 of the circuit of Fig. 1.

The values of resistor 4 and capacitor 6 are chosen to provide a time constant which is significantly greater than the switching time of the ferroelectric capacitor 18. Thus, the turnoff time of the pulse regenerative circuit of Fig. 1 is governed by the switching time of the ferroelectric capacitor 18. It will be noted that the feedback from the collector 13 of transistor 2 to the base 11 of transistor 1 is possible only if the ferroelectric capacitor 18 is in a condition of remanent polarization which can be switched to the direction shown by the arrow. Thus, in accordance with my invention, the circuit of Fig. 1 is capable of regenerative action only during the time the ferroelectric capacitor 18 is switching to its initial condition of remanence.

Figure 2:
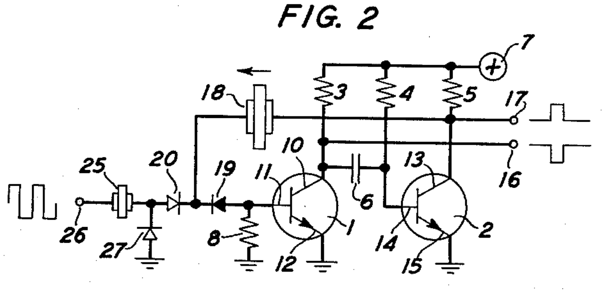
Fig. 2 is a schematic representation of a pulse counting circuit comprising a second specific embodiment of my invention.

The schematic diagram of Fig. 2 depicts a pulse regenerating circuit as shown in Fig. 1 to which a charge metering ferroelectric capacitor 25 has been added to provide a novel pulse counting circuit in accordance with an aspect of my invention. The charge metering ferroelectric capacitor 25 is connected between the pulse regenerating circuit and input terminal 26 to which a train of pulses to be counted is applied. In this embodiment of my invention the ferroelectric capacitor 18 is larger than the ferroelectric capacitor 25, the ratio of their effective capacitances being determined by the number of input pulses which are to be counted to produce a single output pulse.

Each positive pulse at terminal 26 switches the ferroelectric capacitor 25 through the rectifier 20, the ferroelectric capacitor 18 and the transistor 2. Each packet of charge passed by ferroelectric capacitor 25 is stored in ferroelectric capacitor 18 and produces a partial switching of the dielectric polarization thereof. Each negative pulse at terminal 26 returns the ferroelectric capacitor 25 to its original remanent polarization state by passing current through rectifier 27. Current in this reverse direction through ferroelectric capacitor 25 is prevented from reaching ferroelectric capacitor 18 by rectifier 20. Once sufficient packets of charge have been passed by ferroelectric capacitor 25 to completely switch ferroelectric capacitor 18, the next positive pulse causes the breakdown of diode 19 and turns transistor 1 on, as was already described with reference to Fig. 1. The remainder of the cycle of operation of the circuit of Fig. 2 occurs as was described with reference to Fig. 1, thus producing a single output pulse at each of the output terminals 16 and 17 for a predetermined number of positive pulses at input terminal 26. When the ferroelectric capacitor 18 has been returned to its original condition of remanence by the regenerative action of the circuit, the counter is ready to begin another count cycle.

In accordance with one aspect of my invention, the transistor 1 in Fig. 2 when conducting is driven into saturation. This provides a slight delay from the termination of the current through ferroelectric capacitor 18 to the end of the positive pulse at terminal 17. This insures the complete resetting of the ferroelectric capacitor 18, without which the circuit would tend to be less accurate in counting the predetermined number of pulses.

In accordance with another aspect of my invention, in the pulse counting circuit of Fig. 2 the ferroelectric capacitor 18 advantageously performs a dual function. It serves as an integrating capacitor for the storage of the input signals being counted as well as a feedback control element to determine the width of the output pulses of the pulse regenerative portion of the circuit.

Figure 3:
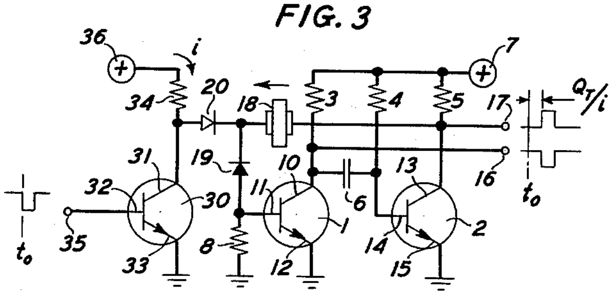
Fig. 3 is a schematic representation of a pulse delay circuit comprising a third specific embodiment of my invention.

In Fig. 3 there is depicted a schematic representation of another specific embodiment of my invention in which a pulse regenerative circuit as shown in Fig. 1 is combined with a transistor 30 and a resistor 34 to provide an improved pulse delay circuit. The transistor 30 has collector, base and emitter electrodes 31, 32 and 33, respectively. An input pulse terminal 35 is connected to the base 32 while the resistor 34 is connected between the collector 31 and a source 36 of positive voltage. The connection between the transistor 30 and the pulse regenerative portion of the circuit is provided by the rectifier 20 situated between collector 31 and the common connection of ferroelectric capacitor 18 and breakdown diode 19. The values of the resistor 34 and the source 36 are arranged to provide an essentially constant current $i$ available as input to the pulse regenerative portion of the circuit under the control of the transistor 30.

In the operation of the circuit of Fig. 3, the application of a negative pulse at terminal 35 turns off normally conducting transistor 30, thus directing the current from source 36 through the rectifier 20 to the ferroelectric capacitor 18. The ferroelectric capacitor 18 is gradually switched by this current $i$ in a time which is equal to $$\frac{Q_T}{i}$$

where $Q_T$ is the total charge required to switch the ferroelectric capacitor 18. Once the ferroelectric capacitor 18 is completely switched, breakdown diode 19 conducts and transistor 1 is turned on thus initiating the pulse regeneration cycle as was described with reference to Fig. 1. In this manner output pulses at terminals 16 and 17 are produced as a result of a negative pulse at input terminal 35, but these output pulses begin at a time $$\frac{Q_T}{i}$$

after the initiating pulse.

In accordance with one aspect of my invention, therefore, the ferroelectric capacitor 18 of this pulse delay circuit functions to control both the delay of the output pulses at terminals 16 and 17 and the duration of these pulses.

Figure 4:
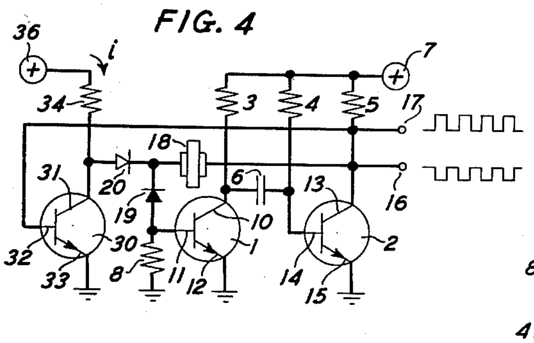
Fig. 4 is a schematic diagram of a self-triggering multivibrator in accordance with this invention.

Fig. 4 depicts a schematic representation of another specific embodiment of my invention which comprises a self-triggering multivibrator circuit, suitable for use as a pulse generator. This circuit is similar to that shown in Fig. 3 with the exception that the base 32 of the transistor 30 is connected to the collector 13 of the transistor 2.

In the operation of the circuit of Fig. 4, the transistor 30 is turned off and on alternately by the series of pulses which are coupled to its base 32 from the collector 13 of transistor 2. This in turn alternately directs the current $i$ through the rectifier 20 and bypasses it to ground. The result is that the pulse regenerating portion of the circuit is caused to cycle repetitively, thereby producing trains of output pulses at the terminals 16 and 17. Since one of these outputs is coupled back to the transistor 30 the circuit is continuously regenerative and functions as a self-contained pulse generator.

In accordance with an aspect of my invention, the ferroelectric capacitor 18 serves to determine the time between pulses as well as the pulse width. Thus, this ferroelectric capacitor controls the repetition rate of the generated pulses.

Figure 5:
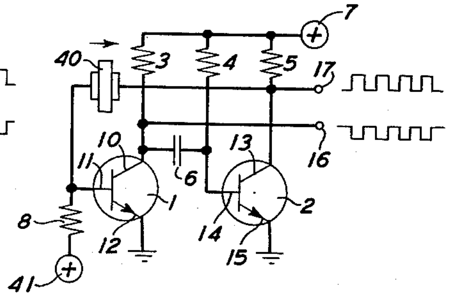
Fig. 5 is a schematic diagram of another self-triggering multivibrator in accordance with my invention.

Fig. 5 is a schematic representation of another specific embodiment of my invention which comprises an improved free-running pulse generating circuit. This is essentially the same as the monostable multivibrator circuit depicted in Fig. 1 with the exception that the ferroelectric capacitor 18 of Fig. 1 is replaced with an internally biased ferroelectric capacitor 40 having its polarization in the direction indicated by the adjacent arrow. The circuit of Fig. 5 also differs from that of Fig. 1 in that the resistor 8, connected to the base 11 of transistor 1, is returned to a source 41 of low positive voltage which serves to bias transistor 1 in the conducting region short of saturation.

In operation, when the biased ferroelectric capacitor 40 is returning to its normal polarization state, the current through resistor 8 drives the base 11 of transistor 1 negative and cuts off this transistor. When the switching is completed, however, transistor 1 begins conducting, sending a negative pulse through capacitor 6, to the base 14 of transistor 2. The regenerative action around the feedback loop then drives transistor 1 into saturation and turns off transistor 2. With transistor 2 off, the voltage source 7 causes the biased ferroelectric capacitor 40 to assume a polarization state opposite to that shown. Once this polarization reversal is complete the current through transistor 1 decreases, initiating a regenerative action which turns on transistor 2. The biased ferroelectric capacitor 40 then returns to its normal polarization state, turning off transistor 1 and initiating another pulse cycle.

In this fashion it can be seen that the biased ferroelectric capacitor 40 controls both the turnon and turnoff of transistor 1, and, through it, transistor 2, thus controlling the repetition rate and duty cycle of the generated output pulses.

It is to be understood that the above-described arrangements are illustrative of the principles of the invention. Numerous other arrangements may be devised by those skilled in the art without departing from the spirit and scope of the invention.

What is claimed is:

1. An electrical circuit comprising a plurality of signal amplifying devices, each having input and output electrodes, biasing means connected to said electrodes for initially establishing a first one of said signal amplifying devices conducting and a second one of said signal amplifying devices nonconducting, first means connecting the output electrode of said first signal amplifying device to the input electrode of the said second signal amplifying device, said first connecting means including a ferroelectric capacitor exhibiting a substantially rectangular hysteresis loop and having first and second states of remanent polarization, second means connecting the output electrode of said second signal amplifying device to the input electrode of said first signal amplifying device, means including said first signal amplifying device for switching said ferroelectric capacitor from said first to said second state of remanent polarization, means including said second connecting means for reversing the conduction states of said signal amplifying devices, and means including said second signal amplifying device for restoring said first state of remanent polarization of said ferroelectric capacitor.

2. An electrical circuit as set forth in claim 1 wherein said means for switching said ferroelectric capacitor further comprises means for applying signal pulses to said ferroelectric capacitor and to said second signal amplifying device.

3. An electrical circuit as set forth in claim 2 wherein said last-mentioned means includes means for blocking said signal pulses from said second signal amplifying device until said ferroelectric capacitor has switched to its second state of remanent polarization.

4. An electrical circuit as set forth in claim 3 wherein said means for blocking said signal pulses comprises a voltage breakdown diode.

5. An electrical circuit as set forth in claim 2 wherein said last-mentioned means comprises a third signal amplifying device in a substantially constant current circuit for delaying the switching of said ferroelectric capacitor from said first to said second remanent polarization state by a predetermined period of time after the application of a signal pulse.

6. An electrical circuit as set forth in claim 5 and further comprising self-triggering circuit means including means connecting the output electrode of said second signal amplifying device to said third signal amplifying device.

7. An electrical circuit as set forth in claim 1 wherein said ferroelectric capacitor exhibits an inherent internal bias and one of said states of remanent polarization is a preferred polarization state.

8. In an electronic counter, a pair of signal amplifying devices cross-connected by feedback means to comprise an electrical circuit having a temporarily stable condition and a preferred stable condition, said feedback means comprising a first ferroelectric capacitor having a substantially rectangular hysteresis loop with two states of remanent polarization, means for applying a predetermined quantity of charge to said ferroelectric capacitor to partially switch the dielectric polarization thereof in response to each of a plurality of signal pulses to be counted, and means for switching said circuit from its preferred to its temporarily stable condition upon the complete reversal of dielectric polarization of said first ferroelectric capacitor so that said circuit produces a single output pulse in response to a predetermined number of said signal pulses.

9. In an electronic counter, a combination as set forth in claim 8 wherein said means for applying said predetermined quantities of charge comprises a second ferroelectric capacitor for determining the quantity of charge delivered to said first ferroelectric capacitor in response to each of said signal pulses.

10. In an electronic counter, a combination as set forth in claim 9 wherein said last-mentioned means further comprises a voltage responsive device between said second ferroelectric capacitor and one of said signal amplifying devices to prevent said quantities of charge from reaching said one signal amplifying device until said first ferroelectric capacitor has completely reversed its dielectric polarization.

11. In an electronic counter, a combination as set forth in claim 8 wherein said electrical circuit comprises means for switching said first ferroelectric capacitor to one of said states of remanent polarization upon the assumption by said circuit of its temporarily stable condition.

12. In an electronic counter, a combination as set forth in claim 11 wherein said feedback means comprises means for retaining said electrical circuit in said temporarily stable condition until said first ferroelectric capacitor is returned to said one state of remanent polarization.

13. An electrical circuit for producing output pulses of predetermined magnitude and duration comprising first and second transitors each having base, emitter and collector electrodes, means connecting the collector electrode of each transistor to the base electrode of the other transistor, said connecting means comprising ferroelectric capacitor means having a substantially rectangular hysteresis loop, biasing means for maintaining said first transistor normally nonconducting and said second transistor normally conducting, means for applying signal pulses to said ferroelectric capacitor means, means including said signal pulse applying means for reversing the state of dielectric polarization of said ferroelectric capacitor means, and means for applying said signal pulses to the base of said first transistor upon said reversal of dielectric polarization of said ferroelectric capacitor means to cause said first transistor to conduct and said second transistor to cease conducting.

14. An electrical circuit as set forth in claim 13 wherein said biasing means further comprises means for returning said ferroelectric capacitor means to its initial state of dielectric polarization upon the cessation of conduction in said second transistor.

15. An electrical circuit as set forth in claim 14 wherein said means for applying pulses to the base of said first transistor comprises means for maintaining said first transistor conducting until said ferroelectric capacitor means has returned to its initial state of dielectric polarization, whereupon said first and second transistors are returned to their normal conduction states.

16. An electrical circuit as set forth in claim 15 wherein said means for applying pulses comprises a voltage responsive device.

17. An electrical circuit as set forth in claim 16 wherein said voltage responsive device comprises a semiconductor voltage breakdown diode.

18. An electrical circuit comprising a pair of transistors, first means connecting the output of one transistor to the input of the other transistor, second means connecting the output of the other transistor to the input of said one transistor, input means connected to said first connecting means, said first connecting means comprising a ferroelectric capacitor, and means for enabling said capacitor to control the application of pulses to one of said transistor inputs and to determine the period of conduction of said one transistor.

19. An electrical circuit comprising a pair of transistors cross-connected by connecting means to provide a multivibrator, a ferroelectric capacitor serially connected in one of said cross-connecting means for determining the ON time of said multivibrator, and means connected to said ferroelectric capacitor for switching the polarization of said ferroelectric capacitor and for triggering said multivibrator to its ON state.

20. An electrical circuit comprising a first and a second transistor each having base, emitter and collector electrodes, means connecting each collector electrode with the base electrode of the other transistor, said connecting means comprising a ferroelectric capacitor, input means comprising a breakdown diode connected to the base electrode of said first transistor, means for successively switching the polarization of said ferroelectric capacitor and breaking down said diode to reverse the output state of said circuit, and means including said diode for resetting said ferroelectric capacitor to determine the length of time said circuit is maintained in said reversed output state.

References Cited in the file of this patent

UNITED STATES PATENTS

| | | |
|---|---|---|
| 2,831,113 | Weller | Apr. 15, 1958 |
| 2,850,630 | Prugh | Sept. 2, 1958 |
| 2,854,590 | Wolfe | Sept. 30, 1958 |